(12) United States Patent
Howard et al.

(10) Patent No.: US 7,447,488 B2
(45) Date of Patent: Nov. 4, 2008

(54) BROADCAST SIGNAL RECEPTION ENHANCING

(75) Inventors: Damian Howard, Winchester, MA (US); Valerie Mollo, Wilmington, MA (US); Kenneth S. Yoshioka, Sutton, MA (US)

(73) Assignee: Bose Corporation, Farmingham, MA (US)

( * ) Notice: Subject to any disclaimer, the term of this patent is extended or adjusted under 35 U.S.C. 154(b) by 496 days.

(21) Appl. No.: 11/176,014

(22) Filed: Jul. 7, 2005

(65) Prior Publication Data

US 2007/0010221 A1    Jan. 11, 2007

(51) Int. Cl.
  *H04B 1/18*    (2006.01)
(52) U.S. Cl. ............... 455/179.1; 455/150.1; 455/180.1
(58) Field of Classification Search ............. 455/186.1, 455/185.1, 3.01, 3.04, 3.06, 161.1, 161.2, 455/158.1, 158.2, 412.1, 412.2, 179.1, 150.1, 455/130, 180.1
  See application file for complete search history.

(56) References Cited

U.S. PATENT DOCUMENTS

| | | | |
|---|---|---|---|
| 4,987,605 A | | 1/1991 | Nose |
| 5,063,610 A | * | 11/1991 | Alwadish ............... 455/45 |
| 5,390,343 A | | 2/1995 | Rupprecht |
| 5,393,713 A | | 2/1995 | Schwob |
| 5,475,874 A | | 12/1995 | Klos |
| 5,515,372 A | | 5/1996 | Porter |
| 5,548,828 A | | 8/1996 | Kozaki et al. |
| 5,584,051 A | | 12/1996 | Goken |
| 5,628,061 A | | 5/1997 | Shirakawa |
| 5,802,066 A | | 9/1998 | Miyake et al. |
| 5,898,910 A | * | 4/1999 | Miyake et al. ............ 455/186.1 |
| 6,021,320 A | * | 2/2000 | Bickford et al. ........... 455/186.1 |
| 6,161,002 A | | 12/2000 | Migliaccio et al. |
| 6,240,280 B1 | | 5/2001 | Ravi et al. |
| 6,411,800 B1 | | 6/2002 | Emerson, III |
| 6,470,178 B1 | | 10/2002 | Cummings-Hill et al. |
| 6,473,792 B1 | | 10/2002 | Yavitz et al. |
| 6,751,401 B1 | * | 6/2004 | Arai et al. ................ 386/83 |
| 6,978,471 B1 | | 12/2005 | Klopfenstein |
| 7,047,050 B1 | * | 5/2006 | Khawand et al. .......... 455/574 |
| 7,197,088 B1 | * | 3/2007 | Yukawa .................. 375/316 |
| 7,356,094 B1 | * | 4/2008 | Ikeda et al. .............. 375/316 |
| 2002/0184038 A1 | | 12/2002 | Costello et al. |
| 2003/0050024 A1 | | 3/2003 | Fukushima |
| 2003/0093790 A1 | | 5/2003 | Logan et al. |
| 2003/0186661 A1 | | 10/2003 | Fricke et al. |

(Continued)

FOREIGN PATENT DOCUMENTS

CN    1251700    4/2000

(Continued)

OTHER PUBLICATIONS

EP Search Report in Appl. No. 06116547.8, dated Oct. 26, 2007.

(Continued)

*Primary Examiner*—Sonny Trinh
(74) *Attorney, Agent, or Firm*—Fish & Richardson P.C.

(57) ABSTRACT

A method for receiving broadcast signals includes selecting a broadcast signal, and receiving selected broadcast signal. Determine parameters about the selected broadcast signal wherein the parameters are based on supplemental broadcast data. Choose a scan interval based on the parameters.

27 Claims, 11 Drawing Sheets

U.S. PATENT DOCUMENTS

| | | |
|---|---|---|
| 2004/0025192 A1 | 2/2004 | Angel et al. |
| 2004/0110522 A1 | 6/2004 | Howard et al. |
| 2004/0168121 A1 | 8/2004 | Matz |
| 2006/0067260 A1* | 3/2006 | Tokkonen et al. ........... 370/310 |
| 2008/0022296 A1 | 1/2008 | Iggulden |

FOREIGN PATENT DOCUMENTS

| | | |
|---|---|---|
| DE | 19830608 A1 | 1/2000 |
| EP | 0 584 839 A1 | 3/1994 |
| EP | 1 139 574 | 10/2001 |
| EP | 1 434 371 | 6/2004 |
| EP | 1 447 928 A1 | 8/2004 |
| EP | 1 139 574 | 10/2004 |
| WO | WO98/44645 | 10/1998 |
| WO | WO 02/03583 A2 | 1/2002 |

OTHER PUBLICATIONS

EP Search Report in Appl. 03104512.3, dated Aug. 23, 2004.
CN Office Action in Appl. 200310116434.X, dated Feb. 15, 2008.
Search Report dated Oct. 26, 2007 from European counterpart application No. 06116547.8 (7 pages).
CN Office Action in Application No. 200310116434.X, dated Aug. 1, 2008.

* cited by examiner

| | 204 | 206 | 208 | | | 214 | | 218 | 220 | 222 | 224 |
|---|---|---|---|---|---|---|---|---|---|---|---|
| Tuned Freq | PI match | RF | RDS | TP | TA | TP Mode On | AF | RT found | RT useful | TMC possible | PRIORITY assigned |
| Test 1: Basic judgment based on RF and RDS | | | | | | | | | | | |
| 226: X | X | 0 | 0 | X | X | X | X | X | X | X | D |
| 228: X | X | OR | OR | X | X | X | X | X | X | X | C |
| Test 2: TMC | | | | | | | | | | | |
| X | X | X | X | X | X | X | X | X | X | 1 | B |
| Test 3: Radio text | | | | | | | | | | | |
| 232: X | X | X | OR | X | X | X | X | 1 | 00 | X | B |
| 234: X | X | X | OR | X | X | X | X | 1 | 01 | X | B |
| 236: X | X | X | OR | X | X | X | X | 1 | 10 | X | C |
| 238: X | X | X | OR | X | X | X | X | X | 11 | X | B |
| Test 4: AF list of foreground broadcast signal | | | | | | | | | | | |
| 240: X | X | X | X | X | X | X | 1 | X | X | X | B |
| Test 5: TP/TA (when TP_mode is selected) | | | | | | | | | | | |
| 242: 0 | X | OR | OR | 0 | 1 | 1 | X | X | X | X | B |
| 244: 0 | X | OR | OR | 1 | 0 | 1 | X | X | X | X | B |
| 246: 0 | X | OR | OR | 1 | 1 | 1 | X | X | X | X | A |
| Test 6: PI match | | | | | | | | | | | |
| 248: 0 | 1 | 0 | 0 | X | X | X | X | X | X | X | B |
| 250: 0 | 1 | OR | OR | X | X | X | X | X | X | X | A |
| Test 7: Foreground tuned broadcast signal | | | | | | | | | | | |
| 252: 1 | X | X | X | X | X | X | X | X | X | X | A |

Fig. 2

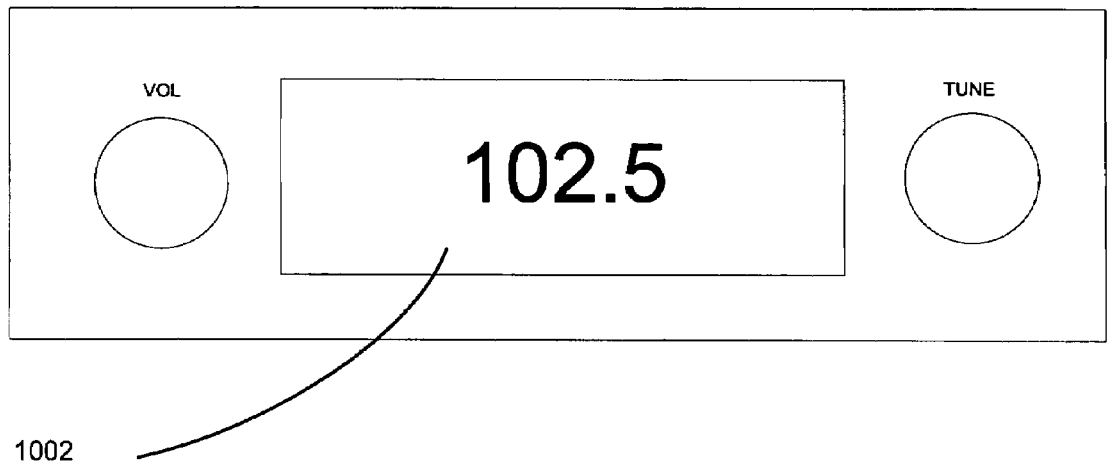
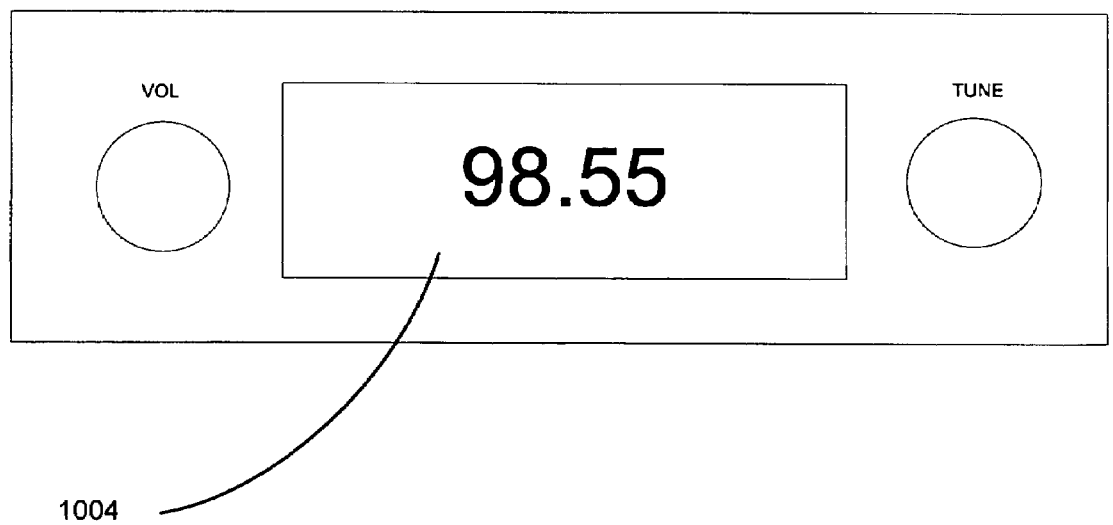
FIG. 10

BROADCAST SIGNAL RECEPTION ENHANCING

The present invention relates to the reception of broadcast signals such as FM radio broadcasts, and more specifically to systems and methods for receiving and processing broadcast signals having both broadcast data and supplemental broadcast data.

BACKGROUND OF THE INVENTION

Systems capable of receiving FM radio signals and decoding embedded metadata may provide additional information about a received broadcast, or about other receivable broadcasts. Such supplemental data is typically broadcast in accordance with the RDS standard (for Radio Data System, as it is known in Europe; the North American standard is known as the Radio Data Broadcast System, however both are customarily referred to as RDS).

Broadcast signals are typically transmitted at fixed intervals within a broadcast spectrum. In the United States, FM signals are usually broadcast at 200 kHz intervals, while in most of Europe the usual interval spacing is 100 kHz. The standard for RDS data transmission reflects this spacing, and RDS decoding systems are typically configured to permit the receipt of data at the expected 100 or 200 kHz intervals.

Many broadcast systems are capable of transmitting supplemental data associated with conventional radio broadcasts. This supplemental broadcast data may provide a receiving system with additional information about a received broadcast program or about other receivable broadcast signals. Examples of such systems are the Radio Data System (RDS) in Europe and the related Radio Broadcast Data System (RBDS) in North America. Such supplemental data can include information such as: a program identifier (PI, or program identification) describing the program being broadcast, which may also be used to identify the geographical availability of the program; the program service name (PS, or program service name, typically the call letters of a broadcast station); the genre or program type (PTY, or program type); an alternate frequencies list (AF, or alternative frequencies list); whether TRAFFIC condition announcements are being broadcast at a given time (TA, or traffic announcement flag) or are generally available on a frequency (TP, or traffic program flag); the time of day (CT, or clock time and date); a free text area left to the discretion of the transmitter (RT, or radiotext); traffic data which permits a display of traffic conditions (TMC, or traffic message channel); information about other stations (EON, or enhanced other networks information); information about the country of origin of the transmission (ECC, or extended country code); the program item number (PIN, or program item number), permitting the unique identification of a specific program by its PI and PIN; data about the content and encoding of an audio signal, such as whether music or speech is being broadcast (MS, or music speech switch); and/or data permitting the receiving system to switch individual decoders on or off, or to indicate whether the PTY code is dynamic (DI, or decoder identification).

SUMMARY OF THE INVENTION

According to an aspect of the invention, a method for receiving broadcast signals includes selecting a broadcast signal, receiving selected broadcast signal, determining parameters about said the selected broadcast signal wherein the parameters are based on supplemental broadcast data, and choosing a scan interval based on the parameters.

According to another aspect of the invention, a method for receiving broadcast signals includes selecting a broadcast signal, receiving selected broadcast signal, determining parameters about the selected broadcast signal wherein the parameters are based on at least one of supplemental broadcast data, location-indicating data, and a user selection, and choosing a scan interval based on the parameters.

According to another aspect of the invention, a method for receiving broadcast signals includes selecting a broadcast signal, receiving the selected broadcast signal, determining parameters about the broadcast signal, wherein the parameters are based on supplemental broadcast data, assigning a priority to the selected broadcast signal, storing the parameters in a memory, choosing a scan interval based on the parameters, assessing the validity of entries in the memory associated with at least one of said parameters and the priority; and modifying the entries based on the assessed validity.

According to another aspect of the invention, a method for receiving broadcast signals includes the steps of selecting a first broadcast signal, receiving the selected first broadcast signal, determining first parameters about the first broadcast signal, wherein the first parameters are based on supplemental broadcast data, selecting a second broadcast signal, receiving the selected second broadcast signal, determining second parameters about the second broadcast signal, wherein the second parameters are based on supplemental broadcast data, comparing the first parameters and the second parameters, choosing one of the first broadcast signal and the second broadcast signal based on the comparing, storing the parameters associated with the chosen broadcast signal; and choosing a scan interval based on the parameters of the chosen broadcast signal.

Other features, objects and advantages of the invention will be apparent from the following description when read in connection with the accompanying drawing in which:

BRIEF DESCRIPTION OF THE SEVERAL VIEWS OF THE DRAWING

FIG. 2 shows a table of tests that may be performed to determine the priority to be assigned to a broadcast signal;

FIG. 10 shows an example of a user interface.

DETAILED DESCRIPTION

The systems and methods of the present invention permit the reception and processing of multiple broadcast signals comprising program data and supplemental data associated therewith. A broadcast signal can include signals such as AM, FM, VHF or UHF transmissions, a satellite broadcast signal such as XM radio, HD Radio (also known as digital radio or IBOC, created by Ibiquity, Inc.) or other known radio frequency or wireless broadcast signal types. Broadcast signals can also include streaming audio over a network, which for example could be provided by an Internet music server or Internet Radio. Broadcast signals can be in analog or digital form. Broadcast signals can also include program and supplemental data that has been encoded and modulated in accordance with the United States RBDS Standard dated Apr. 9, 1998. Program and supplemental data can be analog or digital, or can be an analog signal modulated by a digital bit stream in some manner. Supplemental data can be RDS data or any other accompanying data transmitted in any protocol or format.

Figure 1:
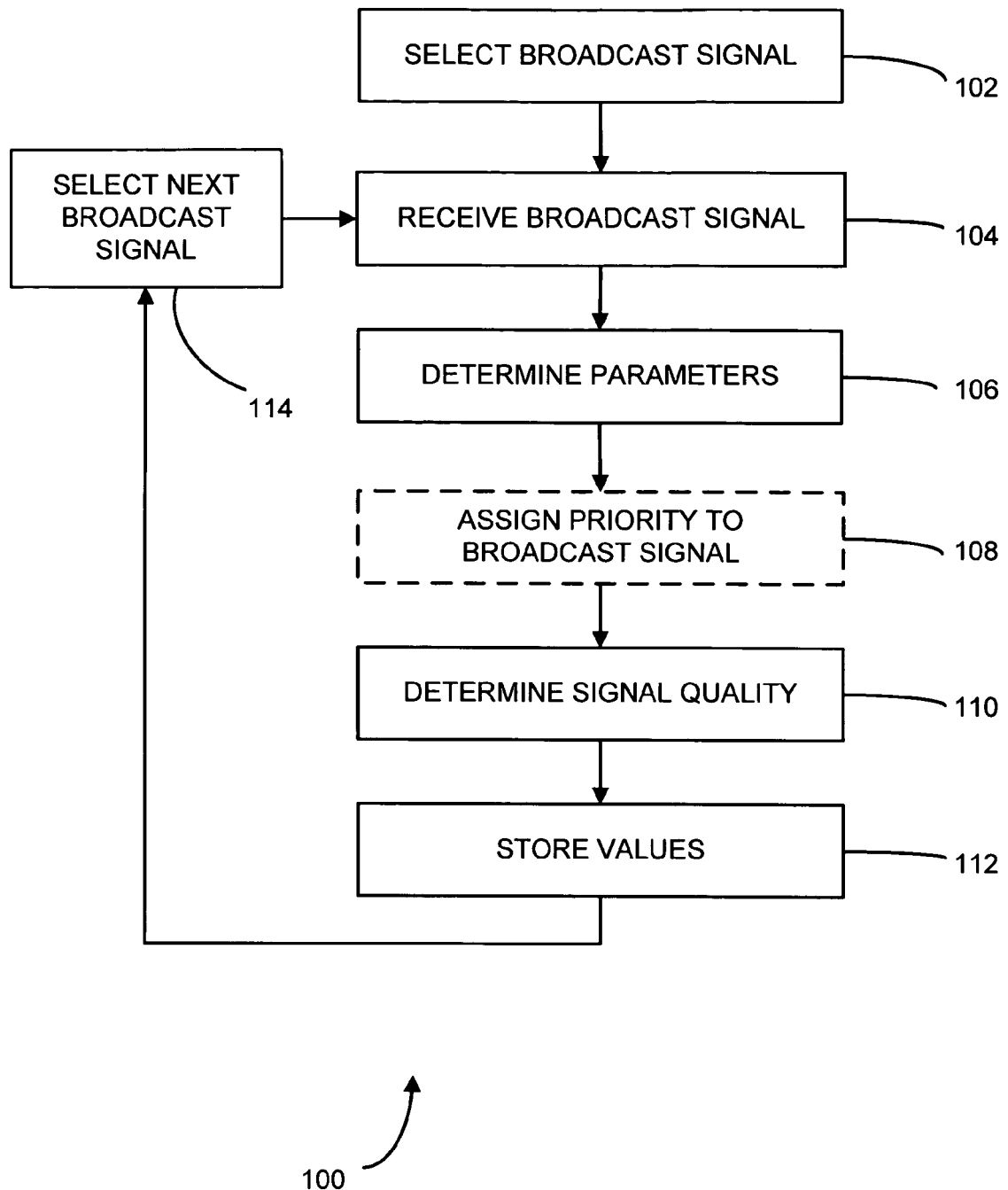
FIG. 1 is a block flow diagram of a method of scanning and characterizing broadcast signals.

FIG. 1 depicts a block flow diagram of a method 100 of scanning and characterizing broadcast signals. The method can permit a system such as the multiple receiver/tuner systems described in U.S. Patent Application No. US2004/0110522, which is herein incorporated by reference, to cycle through a range of receivable broadcast signals and to determine and update parameters regarding those broadcast signals. In an embodiment, a system may be employed to receive an FM broadcast with a first receiver (hereafter referred to as "foreground reception" of a "foreground signal" by a "foreground receiver"), while simultaneously gathering data regarding other receivable broadcast signals by a second receiver (hereafter referred to as "background scanning" of a "background signal" by a "background receiver") at the direction of a processor. Method 100 can permit background scanning of all receivable broadcast signals and the collection of supplemental broadcast data from background signals. Parameters can be determined regarding a range of broadcast signals received by a background receiver regardless of whether supplemental data is received in the foreground receiver.

First, a broadcast signal is selected 102 from a range of such signals, for example, all receivable frequencies in the FM frequency band. Next, the selected broadcast signal is received 104, and parameters about the broadcast signal can be determined 106. Parameters can include, for example, the presence of a broadcast signal at a particular location (for example, at a given frequency), the strength of the signal, the presence of supplemental data in the broadcast signal (for example, RDS data), the supplemental data error rate, the program identification code, and the program type value. Parameters may also include the values of the supplemental data associated with the broadcast signal, such as the PI, PS, PTY, AF, TP/TA, TMC, and RT.

Next, a priority may be assigned 108 to the broadcast signal based on the parameters determined. The assigned priority is used to determine an amount of scanning time allocated to a broadcast signal, as further described below.

Next, a value for signal quality of each broadcast signal is determined 110. This signal quality value can be used to further rank the highest priority broadcast signals. The calculation of signal quality is discussed below.

The parameters, the assigned priority and the determined signal quality for each broadcast signal is stored in memory 112. Finally, a next broadcast signal is selected 114, and the cycle may then be repeated. The cyclical repetition of method 100 permits the parameters regarding each receivable broadcast signal to be redetermined and updated over time.

The amount of time required to continuously scan each receivable broadcast signal and determine its parameters creates difficulties in maintaining useful parameter values for each broadcast signal. For example, the amount of time necessary to receive supplemental data depends on the amount of data transmitted at a particular point in time (when a song is playing, for example) and the data transmission rate. In the RDS system, typically a 57 kHz carrier is modulated to provide an overall data transmission rate of 1187.5 bits per second. According to the RDS standard, the minimum amount of supplemental data that is broadcast (if supplemental data is being broadcast) is one group, or 104 bits. It is also possible that more than one unique data group is broadcast in association with particular program data. In the United States, there are 102 allocated frequencies for FM broadcast, in Europe there are 206, and in Japan there are 141.

In order to enhance the processor duty cycle for method 100, the priority assigned to each broadcast signal is employed to algorithmically determine scanning times for broadcast signals (as further described below). A duration of scanning time corresponding to the assigned priority is assigned to each broadcast signal. Broadcast signals assigned higher priorities are scanned for a greater amount of time than signals assigned lower priorities. Two factors considered to enhance the processor duty cycle are: (1) certain characteristics of the broadcast signal, such as the presence or absence of certain supplemental broadcast data are used to assign a priority to each receivable broadcast signal; and (2) a value of signal quality is determined and used to further rank those broadcast signals.

Certain signal characteristics as well as the presence or absence of certain supplemental broadcast data can be used in the assignment of a priority. Greater weight can be assigned, for example, to a broadcast signal which has a signal strength greater than a predefined minimum. Greater weight can also be assigned to a broadcast signal which is identified as an AF (alternate frequency) signal, or which carries or is currently broadcasting a traffic announcement, or which has the same PI or regional PI code as a selected broadcast signal being received by the foreground receiver, or which carries RT (radio text) or EON (enhanced other network) data. Conversely, less weight can be assigned, for example, to a broadcast signal which lacks supplemental broadcast data.

Additionally, user selections can be factored into an assigned priority. For example, using user interface, such as a user interface shown in U.S. Patent Application No. US2004/0110522, a user can indicate a desire to hear, for example, traffic announcements. In such case, a higher priority is assigned to a broadcast signal identified as having that information (by means of, for example, detection of TA or TP data, or of TMC data). Other examples include enabling switching to alternate frequencies (AF), selecting a preference for regional or nonregional broadcasts, setting a genre preference and selecting a preference for broadcasts with TMC data.

As parameters change over time, the priorities assigned to each broadcast signal can be promoted or demoted. Higher priority broadcast signals can consequently be assigned greater scanning time, while lower priority broadcast signals can receive correspondingly less duty cycle time. In one embodiment, one of four priorities may be assigned, A, B, C and D, with A being the highest and D being the lowest priority.

FIG. 2 shows table 200 of tests that may be performed to determine the priority to be assigned to a broadcast signal. In an embodiment of the invention, the tests may be performed in sequence, with each subsequent test modifying the priority ultimately assigned to a broadcast signal. In table 200, an "X" indicates that the parameter in a cell is a "don't care" condition for that test, "0" means the parameter in the column of interest is not detected, "1" indicates the parameter is detected, and "OR" indicates a test where either condition, or both conditions, are met.

Test 1 examines the RF level (column 206) and RDS data present (column 208) parameters. If, as in row 226, the RF level detected is below a set threshold and no RDS data is present, the broadcast signal is given the lowest priority D (column 224). However, if either the RF level is above a set threshold or RDS data is present, the priority is set to C (row 228).

Test 2 determines whether TMC messages are possibly being currently transmitted or not. The determination may be made by detecting the presence of either the "3A" or "8A" group type identifier which is contained within a "B" RDS block of data, as set forth in the RBDS standard. Upon detection of such an identifier, this flag is set (1) (column 222). In empirical field tests the transmission of these identifiers has been found to be infrequent. In one embodiment, a counter-based methodology is used to clear this value. The number of times a broadcast signal is scanned is stored in memory; if no identifiers are found within 50 interrogations, then the "TMC possible" value is reset to (0) and the priority is lowered if all other tests indicate to do so.

Test 3 determines whether radio text is found (column 218), and whether the radio text data is complete or useful (column 220). ("Useful" data is data which can be successfully parsed, and is further described below.) Data in column 220 may be presented as a two-digit number, the first digit signifying whether the radio text string is complete (1) or incomplete (0), the second digit signifying whether the text data may be parsed (1) or not (0). If, as in row 232, radio text is present, and the data received is incomplete and not useful, priority is set to B. If radio text is present and the data is incomplete but useful (row 234), priority is set to B. If radio text is present, and the data is complete but not useful (row 236), then priority is lowered back to C. If radio text is present and the data is both complete and useful (row 238), priority is set to B.

In test 4, if the broadcast signal received in the background is included in the AF list associated with the broadcast signal received by the foreground tuner, the priority is set to B (row 240).

Test 5 detects traffic data, and is performed if TP mode has been selected by a user (i.e., a user has enabled the system to search for stations that contain traffic data, shown by a value of 1 in the "TP Mode On" column 214). If TA data (traffic data) is present, the priority is set to B (row 242). If TP is detected (i.e., the frequency is capable of broadcasting traffic data), the priority is set to B (row 244). If both TP and TA are present (i.e., the frequency is capable of broadcasting traffic data and is currently broadcasting traffic data), then the priority is set to A (row 246).

Test 6 detects the PI (program identifier) 204 of the selected broadcast signal. If the PI of the background broadcast signal matches the PI of the foreground broadcast signal but the received RF level (of the background signal) is below a threshold and the RDS present flag is set to "0," row 248, then the priority is set to B. If there is a PI match, and either the RF level is sufficient or RDS data is received, row 250, then the priority is set to A. It is possible to have a PI match without RDS data present at that moment because the PI is stored until it is updated. For example, upon entering a tunnel the RDS data may disappear temporarily but memory of the PI would still exist.

Finally, in test 7, if the background broadcast signal is the same as the foreground broadcast signal (row 252), the priority is set to A.

Among the group of highest priority broadcast signals, the signal quality of a broadcast signal is also considered to permit the optimization of the background scanning duty cycle. In a geographical area with a dense concentration of broadcast stations, for example, there can be a large number of broadcast signals that the system can prioritize into the higher priority categories. It is logical that broadcast signals having the highest signal quality be monitored more closely, as they are the most likely broadcast signals which the system may be directed to receive at some future time.

In one embodiment of the present invention, signal quality may be determined as a weighted average of both the instantaneous and time-averaged received signal strength, and the instantaneous and time-averaged error rate of the supplemental broadcast data received. There are numerous equivalent methods of calculating the signal quality, and any other manner of determining signal quality permitting the described advantages may be used.

In one embodiment, a value for an intermediate variable, here called "Q", is determined. The value of Q may be between 0x00 and 0xFF (providing that the weighting values are correctly adjusted), and may be calculated accordingly:

$$Q=[(<RF\_weight>/255)*`RF\;level']+[(<ERROR\_weight>/255)*`average\;RDS\;block\;error\;rate']$$

<RF_weight> is a weighting contribution factor of the 'RF level'. A suitable value for <RF_weight> may be determined through experimentation. <RF_weight> can be between 0x00 and 0xFF. According to empirical field testing, a useful value for <RF_weight> is 0x80, that is, 50% contribution.

'RF level' is a scaled integer value of the received signal field strength of the background tuner. 'RF level' has a scale of 100 counts or 0x64, where the higher the number the stronger the signal field strength. In one embodiment, for a field strength of 60 dBuV the RF level may be 56 counts or 0x38. This measurement may be made at the completion of the time period during which the background frequency is scanned.

<ERROR_weight> is the weighting contribution factor of the 'average RDS block error rate'. A suitable value for <ERROR_weight> may be determined through experimentation. <ERROR_weight> may be between 0x00 and 0xFF. Experimentation reveals that a useful value for <ERROR_weight> is 0x80, that is, 50% contribution.

'RDS block error rate' ("RdsQ") relates to the ratio of good RDS blocks received versus the number of blocks that could possibly be received during the time period that the background frequency is selected (based on the max rate of one block every 22 mS). This ratio may be then multiplied by 100 and is stored as a percentage. Values for 'RDS block error rate' may vary between 0x00 and 0x64, where 0x64 indicates that all possible blocks were successfully received as valid blocks (100%).

Each received RDS block is automatically error-corrected by the RDS decoder, which may report whether the received block was successfully corrected or not. If the block was not successfully corrected, then the block is calculated as having an error. The 'average RDS block error rate' may then be calculated as the moving average of 'RDS block error rate.'

The two previous values for 'RDS block error rate' (RdsQ$_{(k-1)}$ and RdsQ$_{(k-2)}$) and the present value for 'RDS block error rate' (RdsQ$_{(k)}$) are used in this calculation:

'average RDS block error rate'=(RdsQ$_{(k-2)}$+RdsQ$_{(k-1)}$+RdsQ$_{(k)}$)/3.

For example, assuming the following values:

<RF_weight>=0x80(128),

'RF level'=0x40(64 or 68 dBuV),

<ERROR_weight>=0x80(128), and

'average RDS block error rate'=0x32(50%),

Q can then be calculated as follows:

Q=(128/255*64)+(128/255*50)=57.22=0x39

The value of Q may be calculated and stored in memory each time the background receiver selects a broadcast signal. An average value of Q may then be calculated by averaging the previous value of Q with the current value of Q for that same broadcast signal:

Avg Q=(Q$_{(k-1)}$+Q$_{(k)}$)/2 such that:

| | | | Time | | | |
|---|---|---|---|---|---|---|
| | T0 | T1 | T2 | T3 | T4 | |
| 'Q' | 10.0 | 20.0 | 20.0 | 10.0 | 15.0 | |
| 'Avg Q' | 10.0 | 10.0 | 15.0 | 20.0 | 15.0 | 12.5 |

At time T0, no previous values of Q exist, so the Avg Q value is not calculated and is made to be equal to Q. At time T1, the Avg Q value is calculated by summing the Q values at times T1 and T0 and dividing by 2.

Using the above-determined values, a calculation for signal quality may be made. Again, two weighting factors are used, <Q_weight> and <AvgQ_weight>. Experimentation has shown that a useful value for <Q_weight> may be 0x80, and that a useful value for <AvgQ_weight> may be 0x80, with 50% contribution from each. Signal quality may thus be calculated:

signal quality (SQ)=[(<Q_weight>/255)*(Q/255)]+
[(<AvgQ_weight>/255)*(Avg Q/255)]

The assigned priorities (and the signal quality for the highest priority broadcast signals) are employed to algorithmically allocate duty cycle time to background scanning of broadcast signals. In one embodiment of the invention, the total time for a complete duty cycle may be represented as:

$T_{cycle}$=[(A$_{time}$*10 mS)*A$_{count}$]+[(B$_{time}$*10 mS)*B$_{count}$]+[(C$_{time}$*10 mS)*C$_{count}$]+[(D$_{time}$*10 mS)*D$_{count}$]

where the variables A$_{time}$, B$_{time}$, C$_{time}$ and D$_{time}$ relate to the time that each broadcast signal is scanned (time variables), and the variables A$_{count}$, B$_{count}$, C$_{count}$ and D$_{count}$ relate to the number of broadcast signals of each of four priorities scanned in a duty cycle (count variables). In one embodiment, the time variable may denote a multiple of 10 mS during which each broadcast signal of a priority group is scanned. This duration permits the collection of supplemental broadcast data from each broadcast signal and for the calculation of signal quality. The time variable for each priority may be different in different geographic locations (for example, because the density and allocation of frequencies may differ between North America and Europe). The time variable values given in the table below were determined to be useful from empirical testing.

| | A | | B | | C | | D | |
|---|---|---|---|---|---|---|---|---|
| Location | Atime Variable | Scan Time | Btime Variable | Scan Time | Ctime Variable | Scan Time | Dtime Variable | Scan Time |
| Europe | 30 | 300 mS | 30 | 300 mS | 15 | 150 mS | 8 | 80 mS |
| North America | 30 | 300 mS | 400 | 4 sec | 15 | 150 mS | 8 | 80 mS |

The count variable describes the number of frequencies of each priority which may be scanned during each duty cycle. Priorities may be cyclically scanned in decreasing order or priority, A through D. Values for the count variables in the following table were determined to be useful for North America and Europe through empirical testing.

| | A | B | C | D |
|---|---|---|---|---|
| Location | Acount Variable | Bcount Variable | Ccount Variable | Dcount Variable |
| North America | 6 | 6 | 4 | 4 |
| Europe | 6 | 6 | 4 | 4 |

The total time for one cycle may therefore be calculated to be:

For Europe:

(300 mS*6)+(300 mS*6)+(150 mS*4)+(80 mS*4)=4,520 mS.

For North America:

(300 mS*6)+(4000 mS*6)+(150 mS*4)+(80 mS*4)
=26,720 mS.

As described above, data regarding each broadcast signal and its assigned priority can be maintained in memory. The system can scan "count variable" number of broadcast signals from each priority group, A through D. Broadcast signals of priorities B, C and D can be scanned sequentially (e.g., from lowest to highest frequency). Broadcast signals from the A priority list, however, can be scanned in the order of their signal quality. The foreground broadcast signal (which always has priority A) is scanned once each cycle, and is typically scanned first. The best alternate broadcast signal (e.g., the frequency in the A list having the highest signal quality value of all remaining frequencies) is scanned every cycle and is typically scanned second. The second best alternate broadcast signal (again ranked according to signal quality) in the A list is scanned every cycle and is typically scanned third.

The remaining broadcast signals of the A list can then be scanned in order (e.g. from lowest to highest frequency). If the entire A list cannot be scanned in a single loop, the scan of the remaining broadcast signals can continue in the next loop. A broadcast signal typically is not scanned twice in the same loop. After "count variable A" number of frequencies have been scanned, "count variable B", "count variable C", and "count variable D" frequencies of B, C, and then D priorities are scanned. For every loop, broadcast signals in priority lists B, C and D are typically scanned in ascending (e.g., frequency) order.

It should be noted that changes in signal quality over time can also be monitored and can be used as a factor in assigning a relative priority to a broadcast signal. A broadcast signal which is determined to have an increasing signal quality value can be assigned a relatively higher priority, and thus can receive correspondingly more scanning time. As such, the present invention can be "predictive" of, for example, the next best available broadcast signal carrying a particular program.

As described above, data regarding each broadcast signal and its assigned priority can be maintained in memory. The system can scan "count variable" number of broadcast signals from each priority group, A through D. Broadcast signals of priorities B, C and D can be scanned sequentially (e.g., from lowest to highest frequency). Broadcast signals from the A priority list, however, can be scanned in the order of their signal quality. The foreground broadcast signal (which always has priority A) is scanned once each cycle, and is typically scanned first. The best alternate broadcast signal (e.g., the frequency in the A list having the highest signal quality value of all remaining frequencies) is scanned every cycle and is typically scanned second. The second best alternate broadcast signal (again ranked according to signal quality) in the A list is scanned every cycle and is typically scanned third.

Figure 1A:
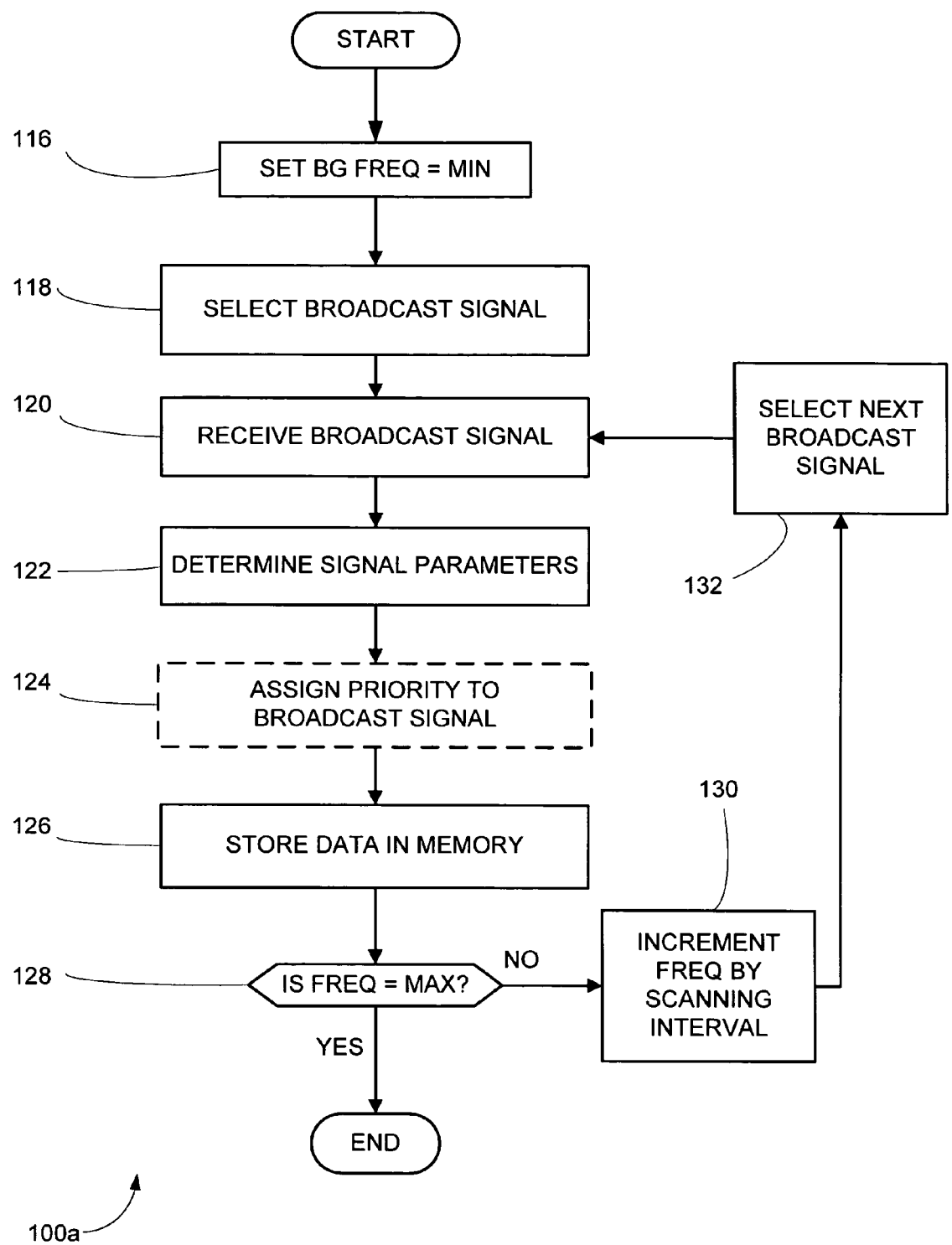
FIG. 1A shows a block flow diagram of a method of scanning and characterizing broadcast signals at intervals smaller than those set forth in the RDS standard.

FIG. 1A shows a method 100a of scanning and characterizing broadcast signals at intervals smaller than those set forth in the RDS standard. A background scan starts with the lowest broadcast signal in a range of such signals 116, for example, all receivable frequencies in the FM frequency band. A broadcast signal is then selected 118 from a range of such signals. Next, the selected broadcast signal is received 120, and parameters about the broadcast signal are determined 122. Parameters can include, for example, the presence of a broadcast signal at a particular location (for example, at a given frequency), the strength of the signal, the presence of supplemental data in the broadcast signal (for example, RDS data), and the supplemental data error rate. Parameters can also include the values of the supplemental data associated with the broadcast signal, such as the PI, PS, PTY, AF, TP/TA, TMC, and RT.

Next, a priority may be assigned 124 to the broadcast signal based on the parameters determined. The assigned priority can be used to determine an amount of scanning time allocated to a broadcast signal.

The parameters and the assigned priority for each broadcast signal are stored in memory 126, which could be configured as a database. If the last broadcast signal in the range has not been reached 128, the scan is incremented by an interval 130, and the next broadcast signal is selected 132 and the method repeated. The cyclical repetition of method 100a permits parameters regarding each receivable broadcast signal to be updated over time. The determination of the interval in step of incrementing 130 is further described below.

The step of incrementing the scan by an interval 130 in method 100a can be performed in a variety of ways. In some geographic areas broadcast signals can be found at intervals smaller than 100 kHz. The RDS standard does not directly provide information about broadcasts at less than 100 kHz intervals (referred to hereafter as "reduced interval broadcasts"). However, it is possible to draw inferences about broadcast intervals from supplemental broadcast data.

Figure 3:
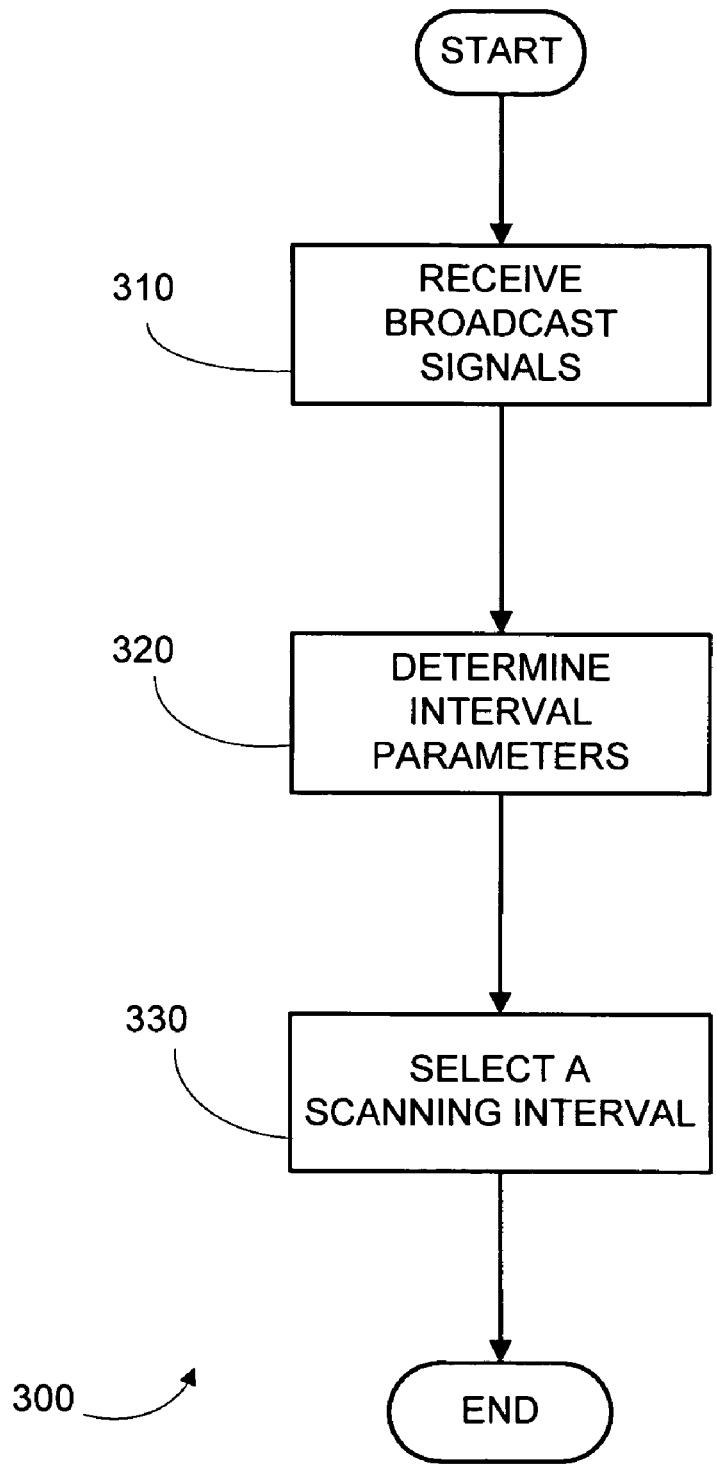
FIG. 3 shows an example of a method of determining a broadcast interval.

FIG. 3 shows a method 300 of determining a broadcast interval. Broadcast signals are received 310, and parameters regarding the broadcast intervals are determined 320. This can be done periodically, or can be performed at some other time such as at system startup. Based on the determined parameters, a scanning interval is selected 330.

Parameters may include a wide range of information determined from the broadcast signal or from the supplemental broadcast data which can be used to determine broadcast intervals. In one embodiment, RDS data can be scanned to detect the Country Code (CC), which is typically the first segment of the program identifier (PI), or to detect the Extended Country Code (ECC), as some CCs and ECCs can be associated with reduced interval broadcasts. Detection of a threshold number of broadcast signals having such CCs or ECCs can also be used in selecting a scan interval.

For example, Italy is a jurisdiction known to permit broadcasts at intervals of 50 kHz. The RDS PI code structure of 16 bits can be used to determine the geographic location of the broadcast. In Europe, each country is assigned an identifier referred to as a country code (CC) and is the first character in the PI code. In addition, an extended country code (ECC) is broadcast that further identifies the geographical location if the same identifier of the PI code is used by multiple countries. For example, a PI code beginning with "5" relates to Italy, Jordan and Slovakia. However, if the PI begins with "5" and the ECC of that broadcast is "E0", then the geographic location of that broadcast is Italy. However, ECC codes are not always available in transmitted RDS data, so various detection thresholds may be employed. Setting a detection threshold at two or more broadcast signals with "Italian" CCs may permit a system either in Italy or in areas bordering Italy which are within range of Italian 50 kHz broadcasts to select a 50 kHz scan interval. Selecting a 50 kHz scan interval would then permit background scanning at 50 kHz intervals. Setting a detection threshold of one Italian CC and one Italian ECC may serve the same function. Other conditions may be used in the selection of a scan interval, such as: whether the PI or ECC codes received in the foreground tuner indicate an Italian broadcast signal; or, whether the percentage of PIs implying Italy stored in the system presets is greater than 75% of the total number of PIs stored; or, whether the most recently received PI code in the foreground tuner indicates a possible Italian broadcast signal; or, whether the percentage of PIs possibly indicating Italy stored in the background database is greater than 20% of the number of receivable broadcast signals; or, whether one or more PIs received within a given period of time indicate a possible Italian broadcast signal. Other factors, such as the time-averaged signal quality or signal strength of a broadcast signal, may also be included in the determination.

The system can also select a scan interval based on a determination of its geographic location. For example, global positioning system (GPS) data, RDS clock-time data (CT), or other location-indicating data, may be used to determine a locale or geographic region. The GPS data can be obtained, for example, from a navigation system, or the system can be coupled to a navigation system. Alternatively, a user may specify a locale or geographic region to the system.

The system can modify the display of information about a received broadcast signal, as well as the signal processing, audio output, and tuning parameters (e.g. band ranges, bandwidths, interval/step sizes) in response, for example, to the geographic determination, or to the scan interval. For example, FIG. 10 depicts a system display 1002 showing a signal broadcast at a 100 kHz broadcast interval, and a system display 1004 showing a signal broadcast at a 50 kHz broadcast interval.

Figure 4:
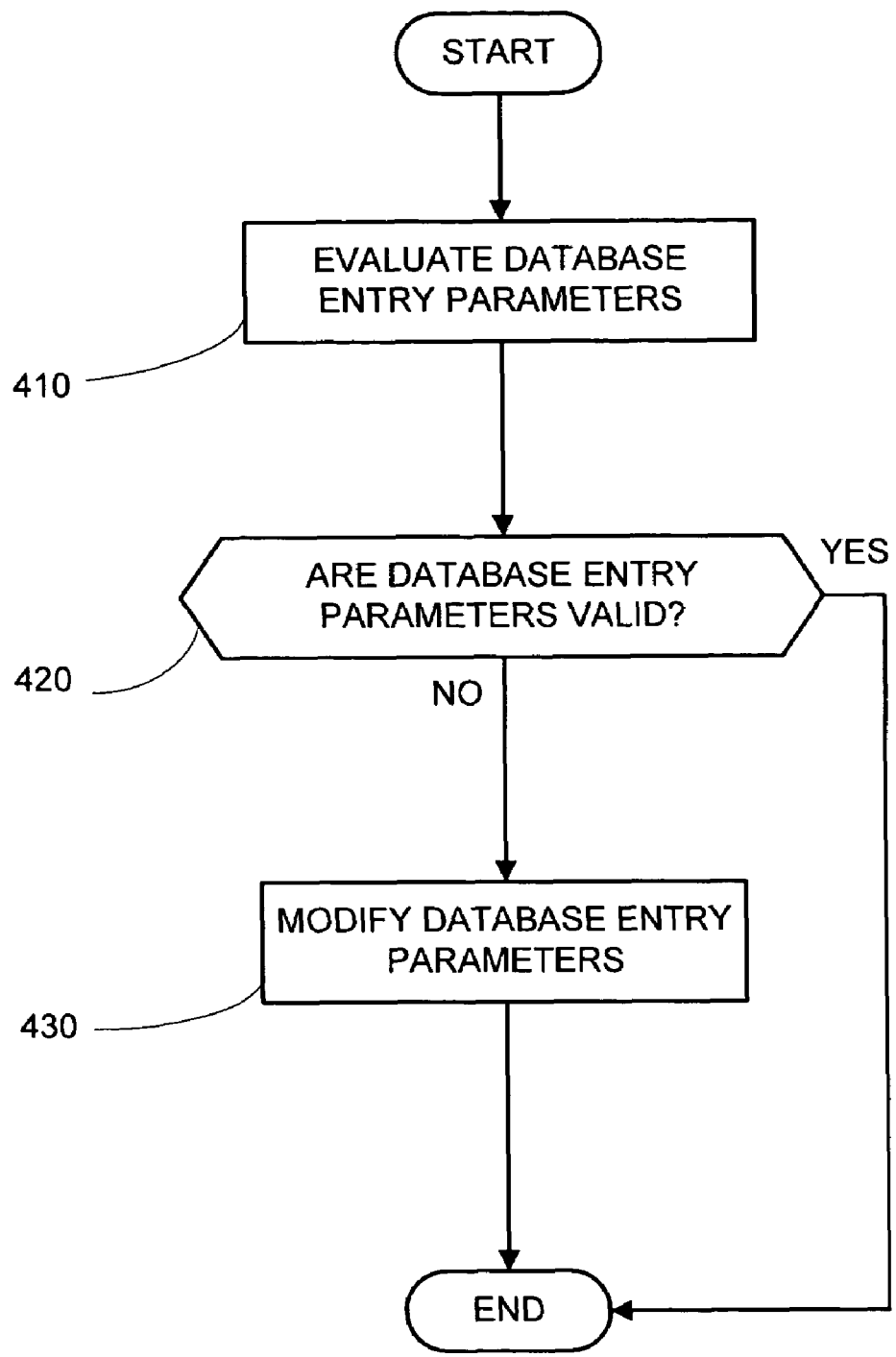
FIG. 4 shows a block flow diagram of a method of dynamically updating database entries.

To update the database and ensure that accurate data is stored, the system can dynamically clear entries from the database. Referring to FIG. 4, the system evaluates parameters associated with database entries 410. The system then determines whether database entries are valid 420, and if an entry is determined to be invalid, the system modifies the entry 430. Parameters in step 410 may be for example, the duration that a receivable broadcast signal remains at a low priority. If a broadcast signal remains at a low priority, e.g., for more than 50 scan cycles, database entries for that broadcast signal can be cleared from the database. Parameters in step 410 may also include a condition where the received PI, CC or ECC conflicts with stored database entries. In another case, if the database contained an entry for a broadcast signal at a particular scan interval (e.g., 50 kHz) and the system were currently scanning at a different interval (e.g., 100 kHz), the system can clear the related database entry.

Figure 5:
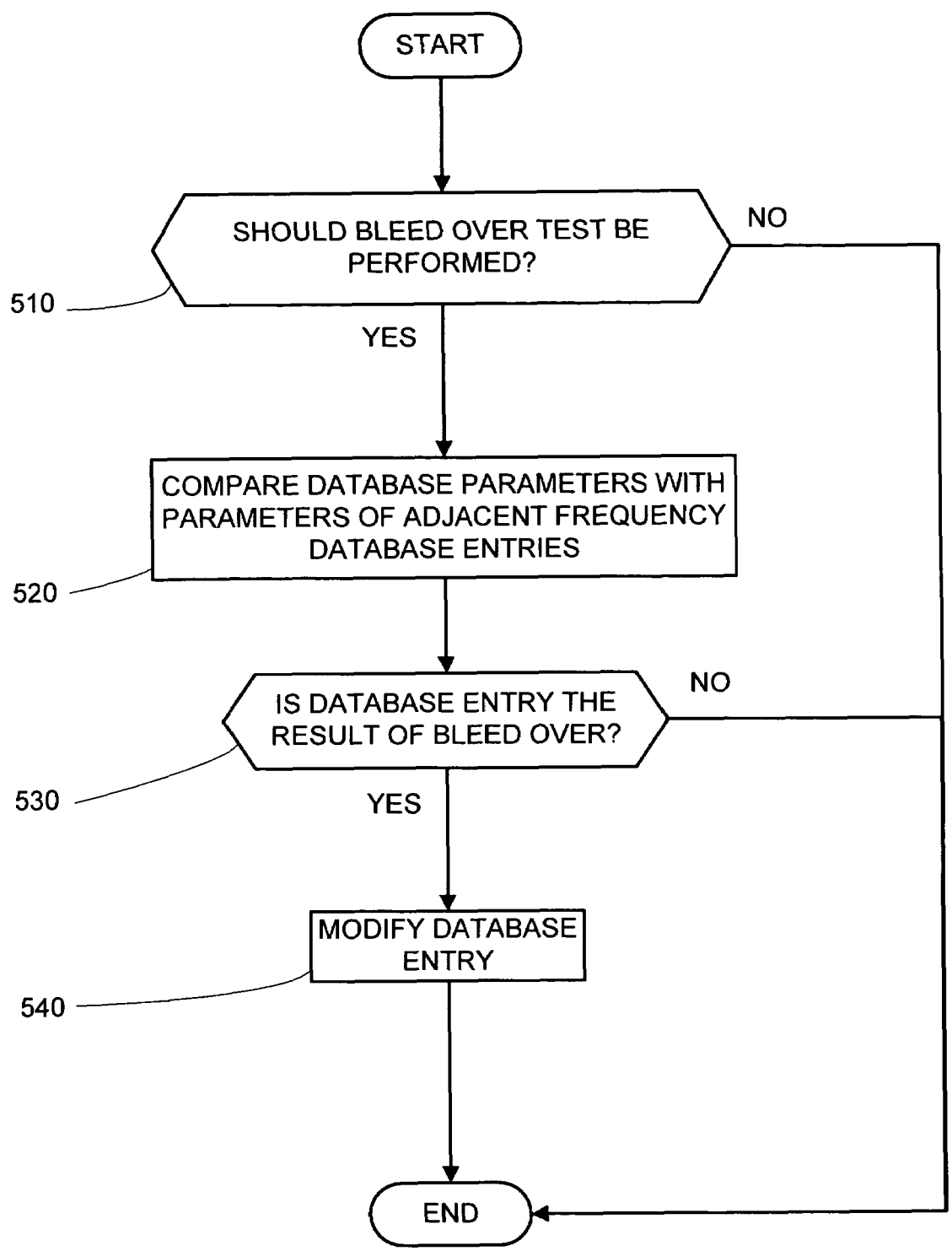
FIG. 5 shows a block flow diagram of a method of detecting bleed over data and clearing corresponding false database entries.

The system can also perform steps to check and to correct stored supplemental broadcast data. This may be especially important when the system is scanning reduced interval broadcasts. For example, a scanned signal's supplemental broadcast data may be the result of signal bleed through from an adjacent broadcast signal in close proximity (referred to as signal bleed-through or bleed-over) which can cause the system to falsely identify the scanned broadcast signal as an alternate signal to the foreground broadcast signal. This in turn may cause the system, for example, to incorrectly identify broadcast signals scanned in the background as possible alternatives to a currently-tuned broadcast signal (i.e., having the same program data). This may cause the system to switch tuning from the foreground broadcast signal to a second broadcast signal which is not a true alternative. To address this, the system can detect bleed through data and clear corresponding false database entries. Referring to FIG. 5, in one embodiment, after each scan of a broadcast signal, the broadcast signal is tested for bleed-through criteria 510. For example, a broadcast signal can be tested to determine if its associated supplemental broadcast data indicates that it is a potential alternative to the foreground signal. A broadcast signal can also be tested if it has program data desired by the user, such as traffic reports, or a certain music type or genre, or a certain song or artist. These determinations can be made by scanning the supplemental broadcast data, or they can be made by processing the supplemental broadcast data.

If the system determines that a broadcast signal should be tested, then database parameters of the broadcast signal being tested are compared with parameters of adjacent broadcast signals 520. Parameters to be compared can include the PI data, RF level, and a time-averaged signal quality. In systems deploying signal processing and algorithmic filtering, other parameters such as stop bit data, channel on-center data, and a noise ratio may be available which can be used to determine the validity of the adjacent broadcast signals 520. Based on the comparison, the system determines if the database entries for the tested broadcast signal are accurate 530, and can modify the entries accordingly 540. Modification may include correcting entries or deleting entries.

Data bleed through can also affect the tuning of the foreground signal. Inaccurate parameters can cause the system to tune to a signal, for example, with different program data than desired. In addition to checking and correcting database entries, the system can also test the foreground signal to confirm the accuracy of parameters associated with it.

Figure 6:
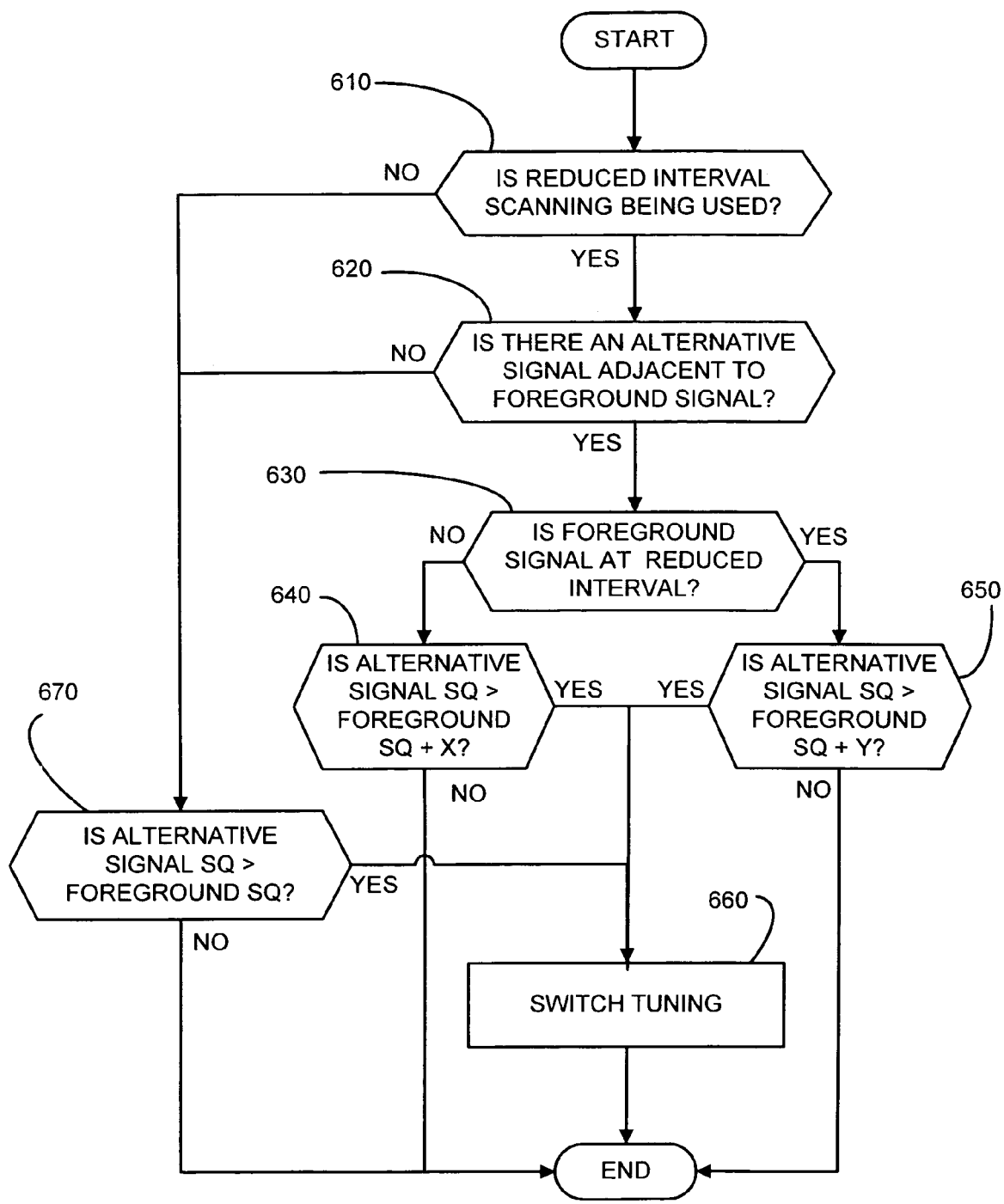
FIG. 6 shows a block flow diagram of a method of testing the foreground signal to confirm the accuracy of parameters associated with it.

Referring to FIG. 6, owing to the greater chance of bleed through at reduced scan intervals, the system can apply different tests depending on whether it is scanning at reduced intervals 610. If it is not, then a comparison between the parameters associated with the foreground signal and a potential alternative signal 670, such as a comparison of the RF levels or of time-averaged signal qualities, can be used to determine whether to switch to the alternative signal 660. If the system is scanning at reduced intervals, the system can determine whether an alternative signal exists adjacent to the foreground signal 620. If not, the system applies test 670, but if so, the system can then determine if the foreground frequency is at a reduced interval location 630, for example, an Italian 50 kHz offset.

The system can then compare the foreground signal and the potential alternative, and depending on the result of determination 630 the system can apply a factor to clarify the result of the comparison. If the foreground signal is at a reduced interval location 650, the system can apply hysteresis factor Y, and if the foreground signal is not at a reduced interval location 640, the system can apply hysteresis factor X. The chance of having inaccurate data from bleed through and similar phenomena is greater when the system is performing scanning at reduced intervals. Also, the chances of having inaccurate data due to bleed through is greater at a reduced interval than at a larger broadcast interval, so, although it is not required, differing X and Y will minimize sporadic switching between two closely spaced alternative broadcast signals with comparable signal quality. In general, the applied hysteresis factor X>Y. Other criteria can be used in steps 640, 650 and 670, such as the RF level of the broadcast signals.

Figure 7:
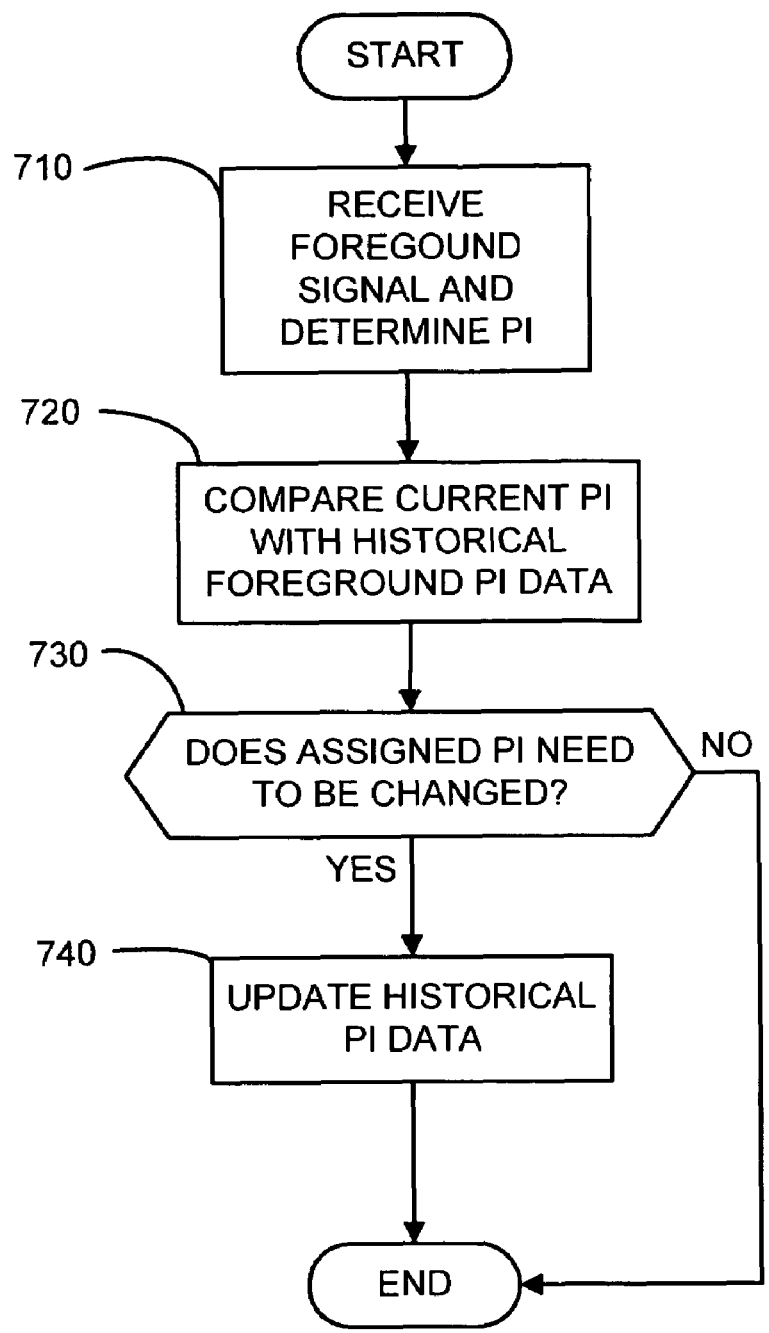
FIG. 7 shows a block flow diagram of an additional method of confirming the accuracy of parameters associated with the foreground signal.

FIG. 7 shows an additional method of confirming the accuracy of parameters associated with the foreground signal. The system stores a history of parameters for the foreground signal for a period of time in order to reduce undesired switching of the foreground signal due to inaccurate supplemental broadcast data received because of, for example, bleed through, signal intermodulation, co-channel interference, multipath effects, or poor short term signal strength. For example, if the foreground signal program data changes, the associated PI will change as well, and that change can trigger a switch to an alternative broadcast signal. However, the system can require that it consistently receive a new PI code for some period of time before updating the database.

Accordingly, the system receives the foreground signal and determines the associated PI 710. It then compares the received PI with the historical PI data stored 720. Based on that comparison, the system determines whether the PI currently associated with the foreground signal should be updated 730. The system can require that a new PI occur some threshold number of times per unit time before updating. It can also require that the new PI occur some consecutive number of times per unit time before updating. The system then updates the assigned PI if necessary 740.

The system can also adjust radio tuning parameters, audio decoding, and audio processing parameters based upon supplemental broadcast data. For example, the system can use any supplemental broadcast data as a basis on which to infer the type of broadcast programming and to adjust audio and tuning parameters accordingly, including the setting of the M/S bit (the music/speech bit, an indicator of program type), or the PTY code, or any RDS data, or processed RDS data.

Though any appropriate supplemental broadcast data or processed supplemental broadcast data can be used for this purpose, system performance can improve if data is used which is changed dynamically with the broadcast material; the PTY is often broadcast in this manner. For example, some programs are broadcast with a boosted bass, which may enhance the appeal of certain genres of music, but which can also make largely voice-only programs such as news, talk radio and traffic alerts, sound too bass-heavy. The system can detect voice programming and adjust system parameters to improve the audio output appropriately. The system can decode the M/S bit or the PTY code and can determine the program type based on it. If appropriate, the system can improve the audio output quality by applying filtering, such as a low-cut filter, or by using signal processing to reduce the amount of bass in the signal.

Thus far this description has assumed that sufficient system memory exists to permit the processing and storage of sufficient data to permit system function. However, space limitations or other constraints may limit the amount of available system memory. This may not permit the collection of data from all receivable broadcast signals, particularly when scanning at reduced intervals; the smaller the scan interval, the greater the number of possible broadcast signals in a given broadcast spectrum. The methods described above can be adapted to systems which have limited memory.

Figure 8:
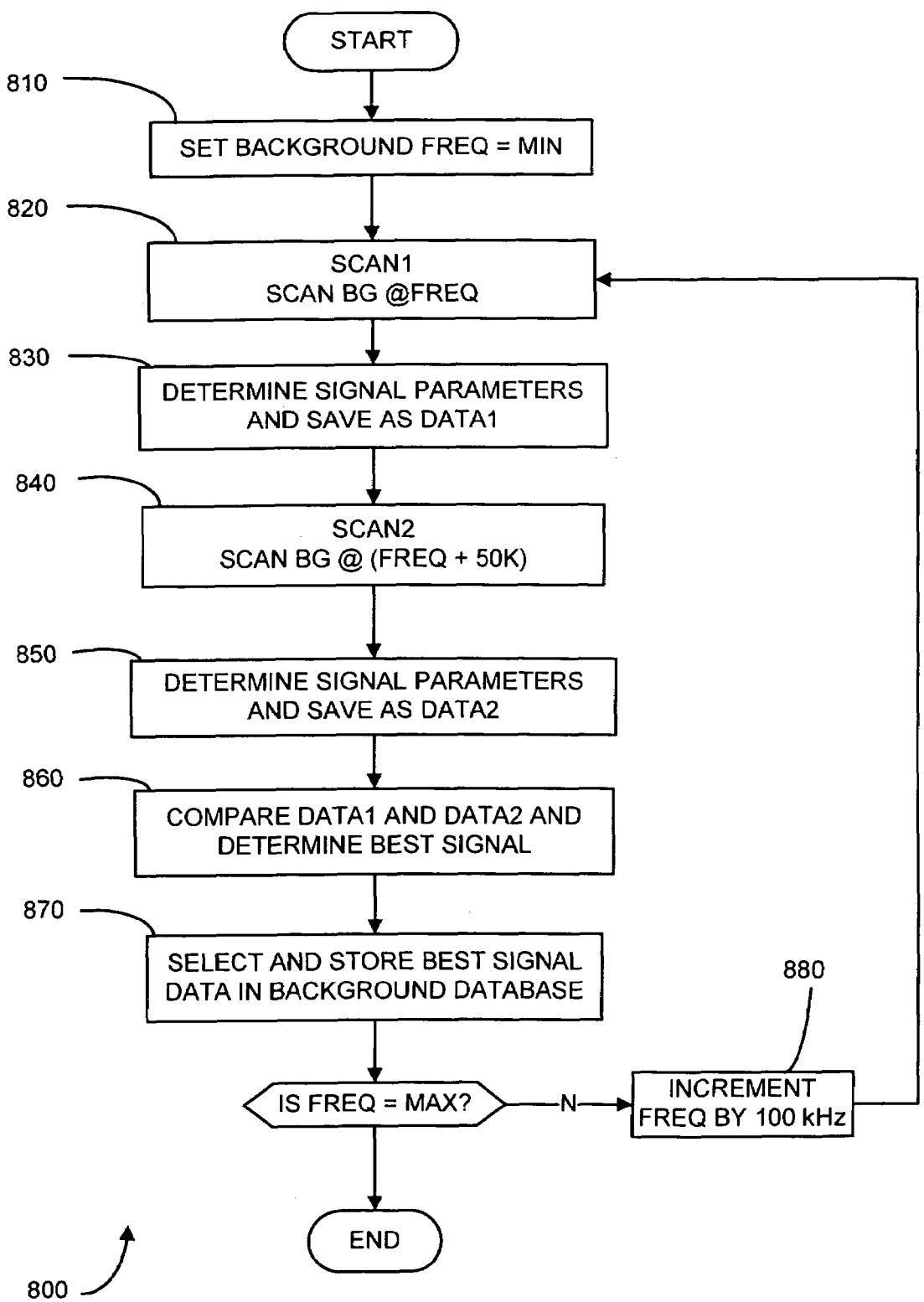
FIG. 8 shows a block flow diagram of a method of indexing reduced interval broadcast signals.

For example, to reduce the amount of memory required by a database of 50 kHz broadcast signals indexed across an entire spectrum, a system with limited memory can store indexes at 100 kHz intervals, and select from among the group of receivable broadcast signals. Referring to method 800 depicted in FIG. 8, starting at the lowest frequency 810, the system scans a first receivable broadcast signal 820, and determines and saves parameters regarding that broadcast signal 830 in a temporary data location. The system then scans a second receivable broadcast signal 840 at some interval above the first broadcast signal, for example, 50 kHz, and determines and saves parameters regarding the second broadcast signal 850 in a temporary data location. The system then compares the parameters from the two broadcast signals 860, and selects and stores data, e.g., in a database, from one of the signals based on the comparison 870. The system then increments by 100 kHz and continues the scan cycle 880.

Parameters determined may include values for PI, TP, TA, AF, RT, TMC, PTY, and RF level, in addition to derived or assigned values such as the number of times a signal has been scanned, an RDS Quality running average, an instantaneous average RDS quality, a signal quality, or RT priority. A comparison of any useful parameter can be used to select one of the received broadcast signals. User preferences can be taken into account as well, for example, if a user has indicated a preference for traffic announcements, a certain program genre or a particular artist.

Figure 9:
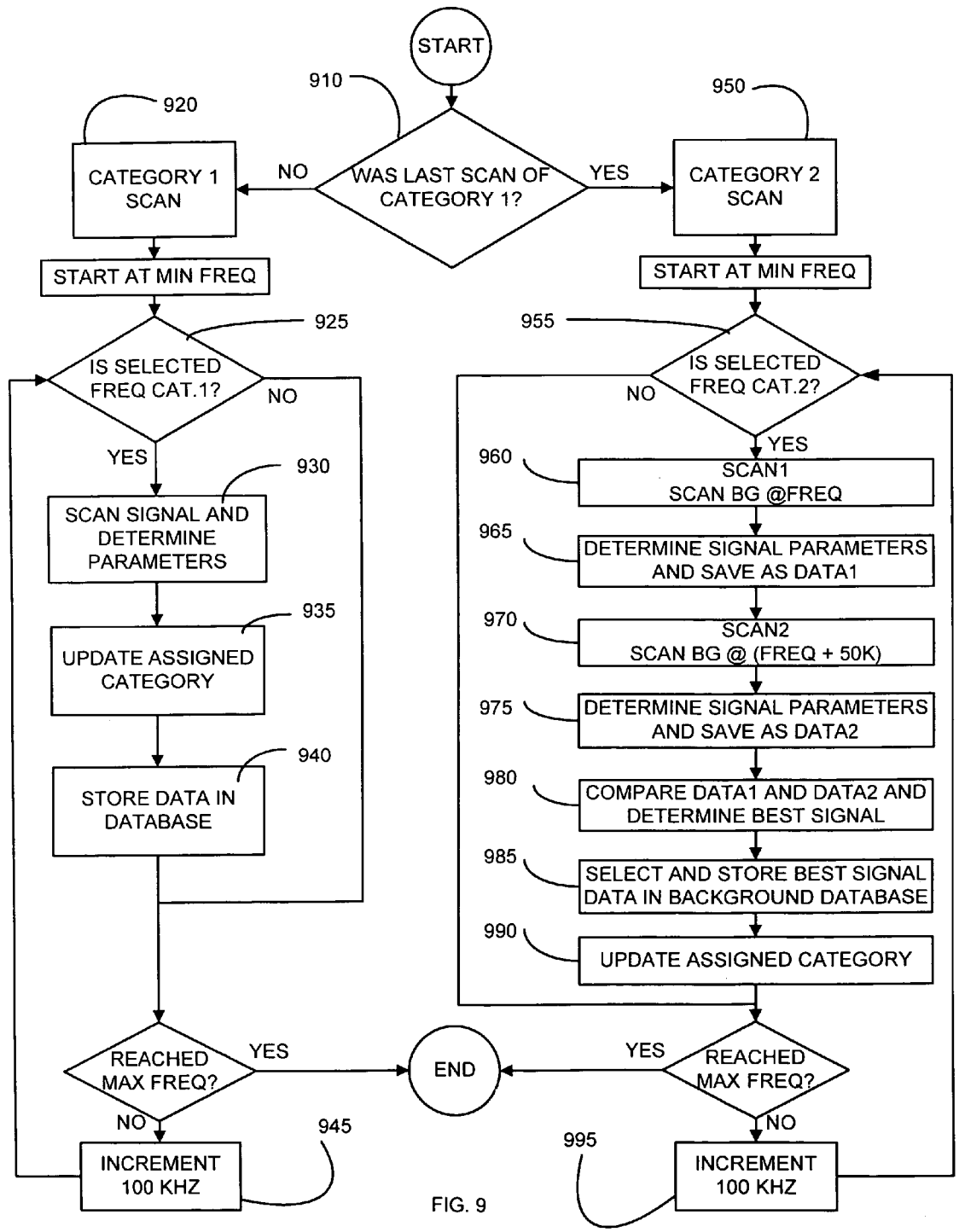
FIG. 9 shows a block flow diagram of an alternative method of indexing reduced interval broadcast signals.

FIG. 9 shows an alternative system resource conserving measure. The system can scan for receivable broadcast signals and sort those broadcast signals into two categories based on a parameter, for example, on an SQ or RF level threshold. Those signals below that threshold can be categorized as, e.g., category 1, and those above can be categorized as, e.g., category 2 (all signals defaulting to category 1 upon system initialization). Category 2 broadcast signals can then receive a greater share of system resources. Each category 1 broadcast signal can be periodically scanned to determine if the threshold is met, and if so, that broadcast signal can be promoted to category 2. Scans of category 1 and category 2 broadcast signals can alternate 910, or each can be repeated or performed several times before the other is performed, such that they can be performed in any combination or pattern.

A scan of category 1 broadcast signals 920 begins at the lowest receivable broadcast signal in the range. Each receivable category 1 broadcast signal is selected 925, the broadcast signal is scanned and parameters about it are determined 930. Based on determined parameters, e.g. SQ or RF level, the assigned category can be updated 935 to category 2 or remain category 1, and the parameters and the assigned category can be stored in the database 940. The scan is then incremented by 100 kHz 945, and the cycle repeated until the end of the broadcast range is reached.

Similarly, a scan of the category 2 broadcast signals 950 starts at the lowest receivable broadcast signal. The first receivable category 2 broadcast signal is selected 955. The system scans the selected broadcast signal 960, and determines and saves parameters regarding that broadcast signal 965 in a temporary data location. The system then scans a second receivable broadcast signal at 50 kHz above the previous frequency 970, and determines and saves parameters regarding that second signal 975. The system then compares the data 980, and selects and stores data from one of the signals based on the comparison 985. Based on determined parameters, the assigned category may be updated 990. The system may then increment by 100 kHz and continue the scan cycle 995.

There has been described novel apparatus and techniques with numerous advantages with numerous advantages. It is evident that those skilled in the art may now make departures specific apparatus and techniques disclosed herein without departing from the inventive concepts consequently, the invention is to be construed as embracing each and every novel feature and novel combination of features disclosed herein and limited only by the spirit and scope of the appended claims.

What is claimed is:

1. A method, comprising:
   receiving a plurality of broadcast signals;
   determining parameters about each received broadcast signal of the plurality of broadcast signals, wherein said parameters include location values encoded in supplemental broadcast data received with each broadcast signal, the determining including associating a location value with each broadcast signal; and
   choosing a scan interval based on a comparison of said parameters.

2. The method of claim 1 wherein, said supplemental broadcast data comprises RDS data and said location values correspond to one of CC, ECC, CT, PI and PS.

3. The method of claim 1 wherein, choosing said scan interval is based on at least one of the detection of a predetermined CC code, or the detection of a predetermined ECC code.

4. The method of claim 1 wherein, said scan interval is less than 100 kHz.

5. The method of claim 1 wherein, said scan interval is 200 kHz, 100 kHz, or 50 kHz.

6. The method of claim 1 further comprising:
   storing at least one of said parameters or said scan interval.

7. The method of claim 1 further comprising:
   using a system with a system display; and
   modifying the system display based on said scan interval.

8. The method of claim 1 wherein choosing said scan interval is based on the detection of a threshold number of location values associated with the plurality of broadcast signals matching a predetermined location.

9. The method of claim 1 wherein said comparison comprises computing a ratio of a number of location values matching a first location to a number of location values matching a second location.

10. The method of claim 1 further comprising
storing a list of the broadcast signals of the plurality and the determined parameters for each broadcast signal, the parameters including an order in which the broadcast signals were received.

11. The method of claim 1 wherein said comparison includes applying a hysteresis factor.

12. The method of claim 11 wherein said comparison comprises determining that a broadcast signal recently added to the plurality is associated with a different location value than broadcast signals already present in the plurality, and
wherein applying said hysteresis factor comprises:
choosing a new scan interval when the recently added broadcast signal is associated with a first predetermined country while the broadcast signals already present in the plurality are associated with a second predetermined country, and
not choosing a new scan interval when the broadcast signals already present in the plurality are associated with the first predetermined country and the recently added broadcast signal is associated with the second predetermined country.

13. The method of claim 12 in which the first predetermined country is associated with a shorter scan interval than the second predetermined country.

14. The method of claim 1 wherein choosing said scan interval is based on the detection of a predetermined CC code in combination with a predetermined ECC code.

15. The method of claim 1 further comprising:
storing the parameters in a memory, and wherein choosing said scan interval is based on a presence of a threshold number of stored parameters including a predetermined CC code.

16. A method, comprising:
selecting a broadcast signal;
receiving the selected broadcast signal;
determining parameters about the selected broadcast signal, wherein said parameters include a value encoded in supplemental broadcast data;
assigning a priority to the selected broadcast signal;
storing said parameters in a memory;
choosing a scan interval based on said parameters;
assessing the validity of entries in said memory associated with at least one of said parameters or assigned priority; and
modifying said entries based on said validity.

17. The method of claim 16 wherein, said parameters further comprise at least one of:
the presence of a broadcast signal at a location; the strength of a broadcast signal; the presence of supplemental data in the broadcast signal; a supplemental data error rate; a time-averaged signal quality; the stop bit; center on-channel data; a noise ratio; whether the broadcast signal has program data desired by a user; historical parameter data; or RDS data.

18. The method of claim 17 wherein RDS data further comprises at least one of CC, ECC, CT, PI or PS.

19. The method of claim 16 wherein, said scan interval is determined based on at least one of the detection of a predetermined CC code, the detection of a predetermined ECC code, the detection of a threshold number of predetermined CC codes, or the detection of a threshold number of predetermined ECC codes.

20. The method of claim 16 wherein, said scan interval is less than 100 kHz.

21. The method of claim 16 wherein, said scan interval is one of 200 kHz, 100 kHz, and 50 kHz.

22. The method of claim 16 wherein, in the step of assessing, said validity is based on at least one of:
the duration that said priority has been a low priority; whether said parameters conflict with said entries; whether said parameters are inconsistent with said scan interval; PI data; an RF level; a time-averaged signal quality; stop bit data; channel on-center data; or a noise ratio.

23. The method of claim 16 wherein, in the step of assessing, a hysteresis factor is applied to said parameters.

24. The method of claim 23 wherein said hysteresis factor is based on said scan interval.

25. The method of claim 16 further comprising:
using a system with a system display; and
modifying the system display based on said scan interval.

26. A method for receiving broadcast signal, comprising:
selecting a first broadcast signal;
receiving the first broadcast signal;
determining first parameters about said first broadcast signal, wherein said first parameters include a value encoded in supplemental broadcast data;
selecting a second broadcast signal;
receiving the second broadcast signal;
determining second parameters about the second broadcast signal, wherein said second parameters include a second value encoded in supplemental broadcast data;
comparing said first parameters and said second parameters;
choosing one of said first broadcast signal and said second broadcast signal based on said comparing;
storing the parameters associated with the chosen broadcast signal;
choosing a scan interval based on the parameters of said chosen broadcast signal.

27. The method of claim 26 wherein said first and second parameters are at least one of:
a value encoded in RDS data; the strength of a broadcast signal; the number of times a broadcast signal has been scanned; a supplemental data error rate; a time-averaged signal quality; or an instantaneous average RDS quality.

* * * * *